United States Patent
Ellis et al.

(10) Patent No.: US 9,904,621 B2
(45) Date of Patent: *Feb. 27, 2018

(54) METHODS AND SYSTEMS FOR FLASH BUFFER SIZING

(71) Applicant: SanDisk Technologies LLC, Milipitas, CA (US)

(72) Inventors: Robert W. Ellis, Phoenix, AZ (US); James M. Higgins, Chandler, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 286 days.

This patent is subject to a terminal disclaimer.

(21) Appl. No.: 14/599,168

(22) Filed: Jan. 16, 2015

(65) Prior Publication Data

US 2016/0019137 A1 Jan. 21, 2016

Related U.S. Application Data

(60) Provisional application No. 62/024,932, filed on Jul. 15, 2014.

(51) Int. Cl.
*G06F 12/02* (2006.01)
*G06F 3/06* (2006.01)
(Continued)

(52) U.S. Cl.
CPC ........ *G06F 12/0246* (2013.01); *G06F 3/0679* (2013.01); *G11C 11/5628* (2013.01);
(Continued)

(58) Field of Classification Search
CPC .. G06F 12/0246; G06F 12/02; G06F 12/0223; G06F 12/023; G06F 12/0802;
(Continued)

(56) References Cited

U.S. PATENT DOCUMENTS

| 4,586,167 A | 4/1986 | Fujishima et al. |
| 5,559,988 A | 9/1996 | Durante et al. |

(Continued)

FOREIGN PATENT DOCUMENTS

| EP | 0 376 285 A2 | 7/1990 |
| WO | WO 2012/083308 | 6/2012 |

OTHER PUBLICATIONS

Seagate Technology, "SCSI Commands Reference Manual, Rev. C", Product Manual dated Apr. 2010, pp. 211-214.

(Continued)

*Primary Examiner* — Zhuo Li
(74) *Attorney, Agent, or Firm* — Morgan, Lewis & Bockius LLP

(57) ABSTRACT

The embodiments described herein are used to allocate memory in a storage system. The method includes, at a memory controller in the storage system, determining a current memory allocation for a set of memory devices, wherein the set of memory devices is formatted with a ratio of first storage density designated portions to second storage density designated portions in accordance with the current memory allocation. The method further includes detecting satisfaction of one or more memory reallocation trigger conditions. The method further includes, in response to detecting satisfaction of one or more memory reallocation trigger conditions, modifying the ratio of the first storage density designated portions to the second storage density designated portions in the set of memory devices to generate a second memory allocation for the set of memory devices.

18 Claims, 5 Drawing Sheets

(51) Int. Cl.
  *G11C 11/56* (2006.01)
  *G11C 16/10* (2006.01)
(52) U.S. Cl.
  CPC ...... *G11C 16/10* (2013.01); *G06F 2212/7204* (2013.01); *G11C 2211/5641* (2013.01)
(58) Field of Classification Search
  CPC ...... G06F 3/061; G06F 3/0619; G06F 3/0665; G06F 3/0688; G06F 2212/1044; G06F 2212/7206; G06F 3/0679; G06F 2212/202; G06F 2212/7204; G11C 2211/5641
  See application file for complete search history.

(56) References Cited

U.S. PATENT DOCUMENTS

| | | | |
|---|---|---|---|
| 5,909,559 | A | 6/1999 | So |
| 6,247,136 | B1 | 6/2001 | MacWilliams et al. |
| 6,292,410 | B1 | 9/2001 | Yi et al. |
| 6,401,213 | B1 | 6/2002 | Jeddeloh |
| 6,449,709 | B1 | 9/2002 | Gates |
| 6,952,682 | B1 | 10/2005 | Wellman |
| 7,969,809 | B2 | 6/2011 | Ben-Rubi |
| 8,010,738 | B1 | 8/2011 | Chilton et al. |
| 8,122,202 | B2 | 2/2012 | Gillingham |
| 8,213,255 | B2 | 7/2012 | Hemink et al. |
| 8,255,618 | B1 | 8/2012 | Borchers et al. |
| 8,321,627 | B1 | 11/2012 | Norrie et al. |
| 8,429,498 | B1 | 4/2013 | Anholt et al. |
| 8,479,080 | B1 * | 7/2013 | Shalvi ............... G06F 11/10 365/185.09 |
| 8,539,139 | B1 | 9/2013 | Morris |
| 8,595,590 | B1 | 11/2013 | Vojcic et al. |
| 8,775,720 | B1 | 7/2014 | Meyer et al. |
| 8,825,967 | B2 | 9/2014 | Hong Beom |
| 8,874,836 | B1 | 10/2014 | Hayes et al. |
| 8,886,872 | B1 | 11/2014 | Norrie |
| 8,924,661 | B1 | 12/2014 | Shachar et al. |
| 8,984,376 | B1 | 3/2015 | Norrie |
| 9,128,825 | B1 | 9/2015 | Albrecht et al. |
| 9,170,876 | B1 | 10/2015 | Bates et al. |
| 9,176,971 | B2 | 11/2015 | Shapiro |
| 9,214,965 | B2 | 12/2015 | Fitzpatrick et al. |
| 9,606,737 | B2 * | 3/2017 | Kankani ............... G06F 3/0616 |
| 9,639,282 | B2 * | 5/2017 | Kankani ............... G06F 3/0616 |
| 2003/0115403 | A1 | 6/2003 | Bouchard et al. |
| 2003/0122834 | A1 | 7/2003 | Mastronarde et al. |
| 2004/0117441 | A1 | 6/2004 | Liu et al. |
| 2005/0144361 | A1 | 6/2005 | Gonzalez et al. |
| 2005/0248992 | A1 | 11/2005 | Hwang et al. |
| 2007/0002629 | A1 | 1/2007 | Lee et al. |
| 2007/0156998 | A1 | 7/2007 | Gorobets |
| 2007/0233937 | A1 | 10/2007 | Coulson et al. |
| 2008/0140914 | A1 | 6/2008 | Jeon |
| 2008/0147994 | A1 | 6/2008 | Jeong et al. |
| 2008/0235466 | A1 | 9/2008 | Traister |
| 2008/0235480 | A1 | 9/2008 | Traister |
| 2008/0291204 | A1 | 11/2008 | Korupolu et al. |
| 2008/0295094 | A1 | 11/2008 | Korupolu et al. |
| 2009/0168525 | A1 | 7/2009 | Olbrich et al. |
| 2009/0177943 | A1 | 7/2009 | Silvus et al. |
| 2009/0222627 | A1 | 9/2009 | Reid |
| 2009/0282191 | A1 | 11/2009 | Depta |
| 2010/0005217 | A1 | 1/2010 | Jeddeloh |
| 2010/0014364 | A1 | 1/2010 | Laberge et al. |
| 2010/0082879 | A1 | 4/2010 | McKean et al. |
| 2010/0165730 | A1 | 7/2010 | Sommer et al. |
| 2010/0174845 | A1 | 7/2010 | Gorobets et al. |
| 2010/0174853 | A1 | 7/2010 | Lee et al. |
| 2010/0220509 | A1 | 9/2010 | Solokov et al. |
| 2010/0250874 | A1 | 9/2010 | Farrell et al. |
| 2011/0113204 | A1 | 5/2011 | Henriksson et al. |
| 2011/0138100 | A1 | 6/2011 | Sinclair |
| 2011/0235434 | A1 | 9/2011 | Byom et al. |
| 2011/0252215 | A1 * | 10/2011 | Franceschini ....... G11C 11/5678 711/170 |
| 2011/0264851 | A1 | 10/2011 | Jeon et al. |
| 2011/0302474 | A1 | 12/2011 | Goss et al. |
| 2012/0030408 | A1 | 2/2012 | Flynn et al. |
| 2012/0047317 | A1 | 2/2012 | Yoon et al. |
| 2012/0159070 | A1 | 6/2012 | Baderdinni et al. |
| 2012/0198129 | A1 * | 8/2012 | Van Aken ............. G06F 12/0246 711/103 |
| 2012/0224425 | A1 | 9/2012 | Fai et al. |
| 2012/0278530 | A1 | 11/2012 | Ebsen |
| 2012/0324180 | A1 | 12/2012 | Asnaashari et al. |
| 2013/0007380 | A1 | 1/2013 | Seekins et al. |
| 2013/0070507 | A1 | 3/2013 | Yoon |
| 2013/0111112 | A1 | 5/2013 | Jeong et al. |
| 2013/0111289 | A1 | 5/2013 | Zhang et al. |
| 2013/0111290 | A1 | 5/2013 | Zhang et al. |
| 2013/0132650 | A1 | 5/2013 | Choi et al. |
| 2013/0182506 | A1 | 7/2013 | Melik-Martirosian |
| 2013/0219106 | A1 | 8/2013 | Vogan et al. |
| 2013/0232290 | A1 | 9/2013 | Ish et al. |
| 2013/0254498 | A1 | 9/2013 | Adachi et al. |
| 2013/0262745 | A1 | 10/2013 | Lin et al. |
| 2013/0297894 | A1 | 11/2013 | Cohen et al. |
| 2013/0346805 | A1 | 12/2013 | Sprouse et al. |
| 2014/0006688 | A1 * | 1/2014 | Yu ...................... G11C 16/10 711/103 |
| 2014/0013026 | A1 | 1/2014 | Venkata et al. |
| 2014/0047170 | A1 | 2/2014 | Cohen et al. |
| 2014/0075100 | A1 | 3/2014 | Kaneko et al. |
| 2014/0143637 | A1 | 5/2014 | Cohen et al. |
| 2014/0148175 | A1 | 5/2014 | Luo |
| 2014/0173239 | A1 | 6/2014 | Schushan |
| 2014/0229655 | A1 | 8/2014 | Goss et al. |
| 2014/0229656 | A1 | 8/2014 | Goss et al. |
| 2014/0241071 | A1 | 8/2014 | Goss et al. |
| 2014/0244897 | A1 | 8/2014 | Goss et al. |
| 2014/0244899 | A1 | 8/2014 | Schmier et al. |
| 2014/0258598 | A1 | 9/2014 | Canepa et al. |
| 2014/0281833 | A1 | 9/2014 | Kroeger et al. |
| 2014/0310241 | A1 | 10/2014 | Goyen |
| 2014/0379988 | A1 | 12/2014 | Lyakhovitskiy et al. |
| 2015/0067172 | A1 | 3/2015 | Ashokan et al. |
| 2015/0074487 | A1 | 3/2015 | Patapoutian et al. |
| 2015/0095558 | A1 | 4/2015 | Kim et al. |
| 2015/0113206 | A1 | 4/2015 | Fitzpatrick et al. |
| 2015/0186278 | A1 | 7/2015 | Jayakumar et al. |
| 2015/0234612 | A1 | 8/2015 | Himelstein et al. |
| 2015/0261473 | A1 | 9/2015 | Matsuyama et al. |
| 2015/0262632 | A1 | 9/2015 | Shelton et al. |
| 2015/0301749 | A1 | 10/2015 | Seo et al. |
| 2015/0331627 | A1 | 11/2015 | Kwak |
| 2016/0026386 | A1 | 1/2016 | Ellis et al. |
| 2016/0034194 | A1 | 2/2016 | Brokhman et al. |
| 2016/0062699 | A1 | 3/2016 | Samuels et al. |
| 2016/0070493 | A1 | 3/2016 | Oh et al. |
| 2016/0071612 | A1 | 3/2016 | Takizawa et al. |
| 2016/0117099 | A1 | 4/2016 | Prins et al. |
| 2016/0117102 | A1 | 4/2016 | Hong et al. |
| 2016/0117105 | A1 | 4/2016 | Thangaraj et al. |
| 2016/0117252 | A1 | 4/2016 | Thangaraj et al. |
| 2016/0170671 | A1 | 6/2016 | Huang |
| 2016/0170831 | A1 | 6/2016 | Lesatre et al. |
| 2016/0179403 | A1 | 6/2016 | Kurotsuchi et al. |
| 2016/0210060 | A1 | 7/2016 | Dreyer |
| 2016/0299689 | A1 | 10/2016 | Kim et al. |
| 2016/0299699 | A1 | 10/2016 | Vanaraj et al. |
| 2016/0299704 | A1 | 10/2016 | Vanaraj et al. |
| 2016/0299724 | A1 | 10/2016 | Vanaraj et al. |
| 2016/0342344 | A1 * | 11/2016 | Kankani ............... G06F 3/0616 |
| 2016/0342345 | A1 * | 11/2016 | Kankani ............... G06F 3/0616 |
| 2016/0371394 | A1 | 12/2016 | Shahidi et al. |

OTHER PUBLICATIONS

Tanenbaum, "Structured Computer Organization", 3rd edition 1990, section 1.4, p. 11, 3 pages.

(56) References Cited

OTHER PUBLICATIONS

International Search Report and Written Opinion dated Jul. 4, 2016, received in International Patent Application No. PCT/US2016/028477, which corresponds to U.S. Appl. No. 14/883,540, 11 pages (Hodgdon).

International Search Report and Written Opinion dated Sep. 8, 2016, received in International Patent Application No. PCT/US2016/036716, which corresponds to U.S. Appl. No. 14/925,945, 13 pages (Ellis).

International Search Report and Written Opinion dated Nov. 18, 2015, received in International Patent Application No. PCT/UW2015/039552 which corresponds to U.S. Appl. No. 14/559,183, 11 pages (Ellis).

International Search Report and Written Opinion dated Nov. 9, 2015, received in International Patent Application No. PCT/UW2015/053551, which corresponds to U.S. Appl. No. 14/668,690, 12 pages (Thangaraj).

International Search Report and Written Opinion dated Nov. 11, 2015, received in International Patent Application No. PCT/UW2015/053582, which corresponds to U.S. Appl. No. 14/659,493, 12 pages (Prins).

Atmel Data-sheet, "9-to-bit Selectable, ±0.5° C. Accurate Digital Temperature Sensor with Nonvolatile Registers and Serial EEPROM" www.atmel.com/images/Atmel-8854-DTS-AT30TSE752A-754A-758A-Datasheet.pdf, Atmel Data-sheet, Mar. 1, 2011, —Atmel-8854-DTS-AT30TSE752A-754A-758A-Datasheet_102014, 57 pages.

International Preliminary Report on Patentability dated May 2, 2017, received in International Patent Application No. PCT/US2015/053551, which corresponds to U.S. Appl. No. 14/668,690, 8 pages (Thangaraj).

International Preliminary Report on Patentability dated May 2, 2017, received in International Patent Application No. PCT/US2015/053582, which corresponds to U.S. Appl. No. 14/659,493, 7 pages (Prins).

* cited by examiner

METHODS AND SYSTEMS FOR FLASH BUFFER SIZING

RELATED APPLICATIONS

This application claims priority to U.S. Provisional Patent Application No. 62/024,932, filed Jul. 15, 2014, which is hereby incorporated by reference in its entirety.

TECHNICAL FIELD

The disclosed embodiments relate generally to memory systems, and in particular, to enabling flash buffer sizing.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Some memory devices come pre-programmed with a specific portion of memory designated to have a first storage density (e.g., one bit per memory cell), and a another specific portion of memory designated to have a second storage density (e.g., two or three bits per memory cell). Initial estimates for the best ratio of the portion of first-density memory to the portion of second-density memory often result in one of the two portions of memory reaching an end of life faster than the other portion.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable flash buffer sizing or memory density reallocation in a non-volatile data storage system.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
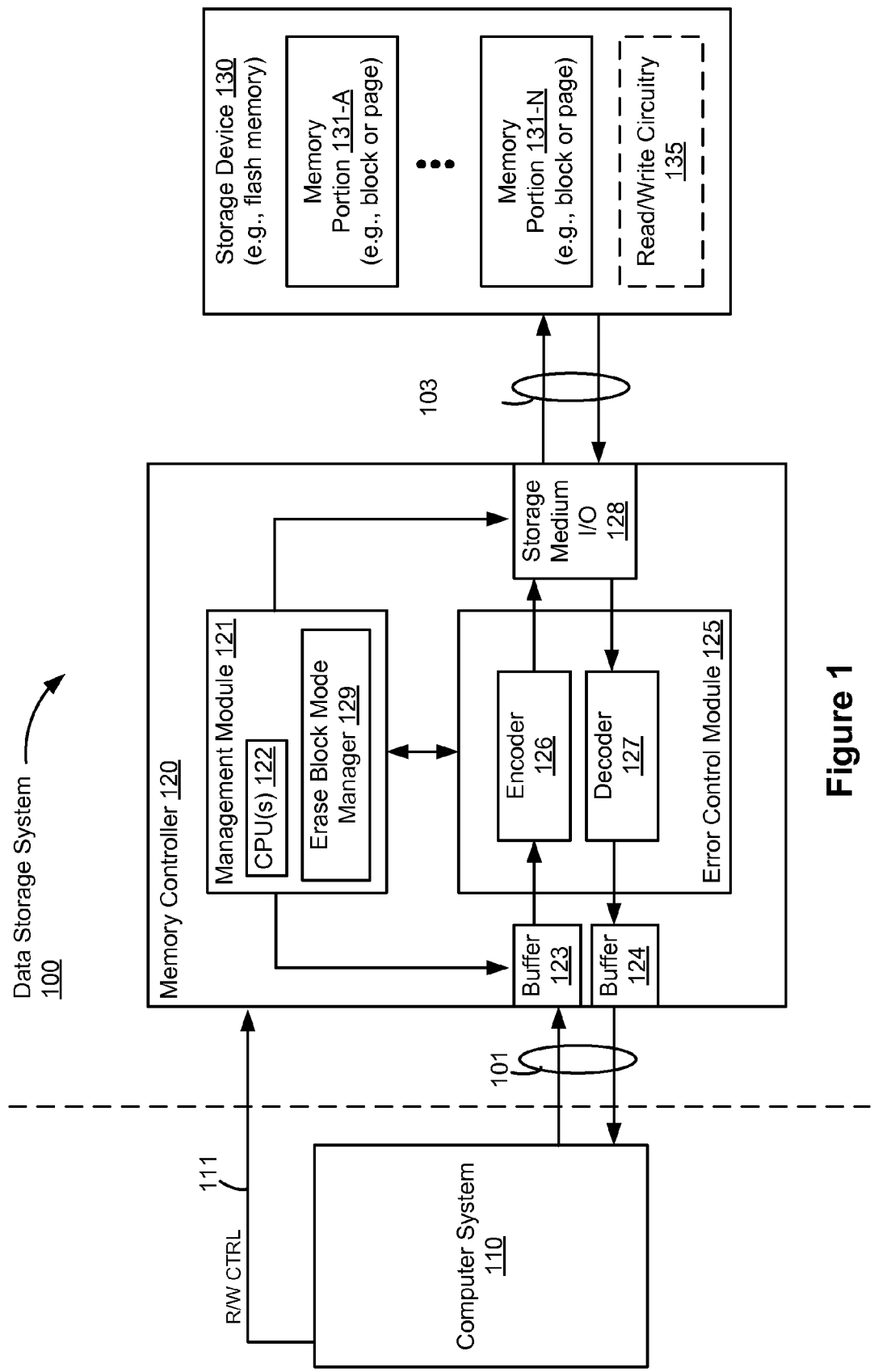
FIG. 1 is a block diagram illustrating a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to dynamically change an allocation of memory portions of a first storage density and memory portions of a second storage density within one or more memory devices. Some implementations include systems, methods and/or devices to enable flash buffer sizing.

Some memory devices are pre-programmed with two portions of memory, each having a different storage density (e.g., the number of bits per cell, such one bit per memory cell, using single level cells (SLC) and three bits per memory cells, suing triple level cells (TLC)). These memory devices are limited to the ratio of memory portions of a first storage density to memory portions of a second storage density, from their initial set-up. As a result, once one of these memory portions reaches its end of life, the entire memory device is considered to have reached its end of life. This is true even if the other memory portion still has a significant number of usable memory portions remaining.

In order to prolong the useful life of a given memory device having two or more portions with differing storage densities, some implementations described herein use techniques to reallocate the portions of memory to change the ratio of memory in first and second portions of the memory device. For example, if a memory device can be reconfigured to be better suited to a particular type of host workload by having more lower-density storage than is currently allocated, its initial memory allocation is modified by converting a number of high-density blocks to low-density blocks.

More specifically, in some embodiments, a method is performed in a storage system that includes a memory controller and a set of memory devices that include a plurality of memory portions. The method includes, at the memory controller, determining a current memory allocation for the set of memory devices, wherein the set of memory devices is formatted with a ratio of first storage density designated portions to second storage density designated portions in accordance with the current memory allocation. The method includes detecting satisfaction of one or more memory reallocation trigger conditions, and in response to detecting satisfaction of one or more memory reallocation trigger conditions, modifying the ratio of the first storage density designated portions to the second storage density designated portions in the set of memory devices to generate a second memory allocation for the set of memory devices.

In some embodiments, modifying the ratio of the first storage density designated portions to the second storage density designated portions in the set of memory devices (to generate the second memory allocation for the set of memory devices) includes selecting one or more erase blocks to switch from the first storage density designation to the second storage density designation, or from the second storage density designation to the first storage density designation, in accordance with the second memory allocation. In some embodiments, the method further includes, after modifying the ratio, determining a revised storage capacity for the set of memory devices and reporting, to a host system, the revised storage capacity of the set of memory devices.

In some embodiments, detecting satisfaction of one or more memory reallocation trigger conditions includes detecting the passage of a predetermined threshold of time. In some embodiments, detecting satisfaction of one or more memory reallocation trigger conditions includes detecting completion of a predetermined number of erase cycles performed on the set of memory devices. In some embodiments, detecting satisfaction of one or more memory reallocation trigger conditions includes detecting observation of a predetermined number of erase failures performed on the set of memory devices. In some embodiments, detecting satisfaction of one or more memory reallocation trigger conditions includes detecting observation of a predetermined threshold of wear on the first storage density designated portions or the second storage density designated portions. In some embodiments, detecting satisfaction of one or more memory reallocation trigger conditions includes receiving a host command to assess the current memory allocation.

In some embodiments, detecting satisfaction of one or more memory reallocation trigger conditions includes determining that the current memory allocation requires modification. In some embodiments, determining that the current memory allocation requires modification includes determining an expected host workload and comparing the expected host workload to a predetermined host workload for the set of memory devices.

In some embodiments, determining that the current memory allocation requires modification includes determining an observed host workload and comparing the observed host workload to a predetermined host workload for the set of memory devices. In some embodiments, determining that the current memory allocation requires modification includes determining an observed write amplification for the set of memory devices and comparing the observed write amplification to a write amplification corresponding to the current memory allocation.

In some embodiments, the storage system includes one or more three-dimensional (3D) memory devices and circuitry associated with operation of memory elements in the one or more 3D memory devices.

In some embodiments, the circuitry and one or more memory elements in a respective 3D memory device, of the one or more 3D memory devices, are on the same substrate.

In some embodiments, the storage system includes one or more flash memory devices.

In some embodiments, the storage system includes a plurality of controllers.

In some embodiments, the plurality of controllers in the storage system include a memory controller and one or more flash controllers, the one or more flash controllers coupled by the memory controller to a host interface of the storage system.

In some embodiments, the plurality of controllers in the storage system include at least one non-volatile memory (NVM) controller and at least one other memory controller other than the at least one NVM controller.

In some embodiments, the storage system includes a dual in-line memory module (DIMM) device.

In some embodiments, one of the plurality of controllers in the storage system maps double data rate (DDR) interface commands to serial advance technology attachment (SATA) interface commands.

In another aspect, any of the methods described above are performed by a storage system that includes (1) a storage device including one or more memory devices, each with a plurality of memory portions and (2) a memory controller with one or more processors and memory storing one or more programs to be executed by the one or more processors, the one or more programs including instructions for performing or controlling performance of any of the methods described herein.

In another aspect, any of the methods described above are performed by a storage device that includes (1) an interface for coupling the storage device to a host system, (2) non-volatile memory, including multiple distinct memory portions of the non-volatile memory, and (3) a set of one or more memory controllers, having one or more processors, the set of one or more memory controllers configured to: (A) determine a current memory allocation for the set of memory devices, wherein the set of memory devices is formatted with a ratio of first storage density designated portions to second storage density designated portions in accordance with the current memory allocation, (B) detect satisfaction of one or more memory reallocation trigger conditions, and (C) in response to detecting satisfaction of one or more memory reallocation trigger conditions, modify the ratio of the first storage density designated portions to the second storage density designated portions in the set of memory devices to generate a second memory allocation for the set of memory devices.

In yet another aspect, any of the methods described above are performed by a storage device that includes means for coupling the storage device to a host system; non-volatile memory means, including multiple distinct memory portions; and controller means configured to: (A) determine a current memory allocation for the set of memory devices, wherein the set of memory devices is formatted with a ratio of first storage density designated portions to second storage density designated portions in accordance with the current memory allocation, (B) detect satisfaction of one or more memory reallocation trigger conditions, and (C) in response to detecting satisfaction of one or more memory reallocation trigger conditions, modify the ratio of the first storage density designated portions to the second storage density designated portions in the set of memory devices to generate a second memory allocation for the set of memory devices.

In some embodiments, the storage device is configured to perform any of the methods described above.

In yet another aspect, a non-transitory computer readable storage medium stores one or more programs for execution by one or more processors of a storage device, the one or more programs including instructions for performing any one of the methods described above.

In some embodiments, the storage device includes a plurality of controllers, and the non-transitory computer readable storage medium includes a respective non-transitory computer readable storage medium for each controller of the plurality of controllers, the non-transitory computer readable storage medium having one or more programs including instructions for performing any of the methods described above, or respective portions of any of the methods described above.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the embodiments described herein.

FIG. 1 is a block diagram illustrating a data storage system 100, in accordance with some embodiments. While some exemplary features are illustrated, various other features have not been illustrated for the sake of brevity and so as not to obscure more pertinent aspects of the exemplary embodiments disclosed herein. To that end, as a non-limiting example, data storage system 100 is used in conjunction with a computer system 110, where data storage system 100 includes a memory controller 120 and a storage device 130. In some embodiments, storage device 130 includes a single memory device (e.g., a volatile memory device or a non-volatile memory (NVM) device such as a magnetic disk storage device, an optical disk storage device, a flash memory device, a three-dimensional (3D) memory device (as further described herein), or another semiconductor NVM memory device). In some embodiments, storage device 130 includes a plurality of memory devices or is one of a plurality of memory devices coupled with memory controller 120. In some embodiments, a memory device includes one or more die, each with two or more individually addressable blocks (e.g., erase blocks). In some embodiments, storage device 130 includes NAND-type flash memory or NOR-type flash memory. Further, in some embodiments, memory controller 120 is a solid-state drive (SSD) controller. However, one or more other types of storage media may be included in accordance with aspects of a wide variety of embodiments.

Computer system 110 is coupled with memory controller 120 through data connections 101. However, in some embodiments, computer system 110 includes memory controller 120 as a component and/or a sub-system. Computer system 110 may be any suitable computing device, such as a desktop computer, a laptop computer, a tablet device, a netbook, an internet kiosk, a personal digital assistant, a mobile phone, a smart phone, a gaming device, a wearable computing device, a computer server, or any other computing device. Computer system 110 is sometimes called a host or host system. In some embodiments, computer system 110 includes one or more processors, one or more types of memory, a display, and/or other user interface components such as a keyboard, a touch screen display, a mouse, a track-pad, a digital camera, and/or any number of supplemental devices to add I/O functionality.

In some embodiments, data storage system 100 includes a host interface (not shown), to couple data storage system 100 with computer system 110. In some embodiments, the host interface provides data, signals, voltages, and/or other information needed for communication between memory controller 120 and computer system 110. In some embodiments, memory controller 120 and the host interface use a defined interface standard for communication, such as double data rate type three synchronous dynamic random access memory (DDR3). In some embodiments, the defined interface standard for communication used by memory controller 120 and the host interface is serial advance technology attachment (SATA). In some other implementations, the defined interface standard for communication used by memory controller 120 and the host interface is SAS (serial attached SCSI), or any other suitable storage interface standard.

Storage device 130 is coupled with memory controller 120 through connections 103. Connections 103 are sometimes called data connections, but typically convey commands in addition to data, and optionally convey metadata, error correction information, and/or other information in addition to data values to be stored in storage device 130 and data values read from storage device 130. In some embodiments, however, memory controller 120 and storage device 130 are included in the same device as components thereof. Furthermore, in some implementations memory controller 120 and storage device 130 are embedded in a host device, such as a mobile device, tablet, computer server, other computer, or computer controlled device, and the methods described herein are performed by the embedded memory controller. Storage device 130 may include any number (i.e., one or more) of memory devices including, without limitation, non-volatile semiconductor memory devices, such as flash memory devices. In some implementations, data storage system 100 is configured for enterprise storage suitable for applications such as cloud computing, or for caching data stored (or to be stored) in secondary storage, such as hard disk drives. Alternatively, data storage system 100 is configured for relatively smaller-scale applications such as personal flash drives or hard-disk replacements for personal, laptop and tablet computers.

In FIG. 1, storage device 130 (e.g., with one or more memory devices) includes a plurality of memory portions 131-A, . . . , 131-N. For example, a respective memory portion is one of a plurality of memory devices in storage device 130, or a die, block (e.g., an individually addressable block, such as an erase block), word line, or page associated with a respective memory device in storage device 130. In another example, a respective memory portion (e.g., a superblock) is a set of memory units in multiple die (e.g., a plurality of erase blocks, such as one per die).

In some embodiments, storage device 130 is divided into a number of individually addressable (and thus individually selectable) blocks. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device. In some embodiments, storage device 130 includes read/write circuitry 135 for selecting a respective portion of storage device 130 on which to perform a memory operation (e.g., a read, write, or erase operation) and for causing performance of the memory operation on the respective portion of storage device 130.

For example, one block includes a number of pages (e.g., 64 pages, 128 pages, 256 pages, or another suitable number of pages). In some implementations, the blocks in a die are grouped into a plurality of zones, sometimes called block zones. Typically, each block zone of the die is in a physically distinct region of the die such as a particular half or particular quadrant of the memory cell array in the die. In some implementations, each block zone is independently managed to some extent, which increases the degree of parallelism for parallel operations and simplifies management of storage device 130.

In some embodiments, memory controller 120 includes a management module 121, an input buffer 123, an output buffer 124, an error control module 125, and a storage medium interface (I/O) 128. In some embodiments, memory controller 120 includes various additional features that have not been illustrated for the sake of brevity and so as not to obscure more pertinent features of the example embodiments disclosed herein, and that a different arrangement of features may be possible. Input buffer 123 and output buffer 124 provide an interface to computer system 110 through data connections 101. Similarly, storage medium I/O 128 provides an interface to storage device 130 though connections 103. In some embodiments, storage medium I/O 128 includes read/write circuitry capable of providing reading signals to storage device 130. For example, the reading signals specify reading threshold voltages for NAND-type flash memory.

In some embodiments, management module 121 includes one or more processing units (CPU(s), also sometimes called one or more processors) 122 configured to execute instructions in one or more programs (e.g., in management module 121). In some embodiments, the one or more CPUs 122 are shared by one or more components within, and in some cases, beyond the function of memory controller 120. Management module 121 is coupled with input buffer 123, output buffer 124 (connection not shown), error control module 125, and storage medium I/O 128 in order to coordinate the operation of these components.

In some embodiments, management module 121 includes erase block mode manager 129. In some embodiments, erase block mode manager 129 assesses and performs memory reallocation on storage device 130 (e.g., changing the ratio of SLC memory portions to TLC memory portions, or the ratio of SLC memory portions to MLC memory portions). In some embodiments, erase block mode manager 129 detects whether more trigger conditions have been met, where a trigger condition has to be met to initiate assessment of storage device 130 for memory reallocation (e.g., passage of a certain amount of time or observation of a certain number of erase cycles performed).

In some embodiments, erase block mode manager 129 automatically adjusts one or more memory reallocation trigger conditions. In some embodiments, memory controller 120 receives one or more host commands from computer system 110 (i.e., a host) to establish or update one or more of the memory reallocation trigger conditions assessed by memory controller 120, or specifically by erase block mode manager 129. In some embodiments, algorithms, code or programming to assess the memory reallocation trigger conditions and perform memory reallocation on storage device 130, are loaded or updated by memory controller 120. In some embodiments this loading or updating occurs during firmware initialization, during power up, during idle operation of the storage device or during normal operation of the storage device.

Error control module 125 is coupled with storage medium I/O 128, input buffer 123 and output buffer 124. Error control module 125 is provided to limit the number of uncorrectable errors inadvertently introduced into data. In some embodiments, error control module 125 is executed in software by one or more CPUs 122 of management module 121, and, in other embodiments, error control module 125 is implemented in whole or in part using special purpose circuitry to perform encoding and decoding functions associated with error correction. To that end, error control module 125 includes an encoder 126 and a decoder 127. In some embodiments, error control module 125 is configured to encode data (i.e., with encoder 126) and decode raw read data (i.e., with decoder 127) according to one of a plurality of error control code (ECC) techniques, or ECC strengths, such as Reed-Solomon (RS), turbo-code, Bose-Chaudhuri-Hocquenghem (BCH), low-density parity check (LDPC), or other error control codes, or a combination thereof.

Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage device 130 from computer system 110 (e.g., write data). The data held in input buffer 123 is conveyed to or made available to encoder 126, which encodes the data by applying an error control code to produce one or more codewords. The one or more codewords are conveyed to or made available to storage medium I/O 128, which transfers the one or more codewords to storage device 130 in a manner dependent on the type of storage medium being utilized.

A read operation is typically initiated when computer system (host) 110 sends one or more host read commands on control line 111 to memory controller 120 requesting data from storage device 130. Memory controller 120 sends one or more read access commands to storage device 130, via storage medium I/O 128, to obtain raw read data, typically in accordance with memory locations (addresses) specified by the one or more host read commands. Storage medium I/O 128 provides the raw read data (e.g., one or more codewords) to decoder 127. Decoder 127 applies a decoding process to the raw read data (sometimes called encoded data) to recover the data, and to correct errors in the recovered data within the error correcting capability of the error control code. If the decoding is successful, the decoded data is provided to output buffer 124, where the decoded data is made available to computer system 110. Optionally, decoder 127 provides an indication of a number of corrected bits. In some embodiments, if the decoding is not successful, memory controller 120 may resort to a number of remedial actions or provide an indication of an irresolvable error condition.

In some embodiments, data storage system 100 includes one or more intermediate modules (not shown), which include one or more processing units (also sometimes called CPUs or processors or microprocessors or microcontrollers) configured to execute instructions in one or more programs. These intermediate modules are coupled to memory controller 120, in order to supervise and control functions such as one or more of: power up and power down, data hardening, charging energy storage device(s), data logging, communicating between modules on storage device 130, endurance management, RAID management, compression, error correction encoding/decoding, encryption, power failure recovery, wear leveling and/or other aspects of managing functions on storage device 130.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise the raw data value is a "0."

Figure 2:
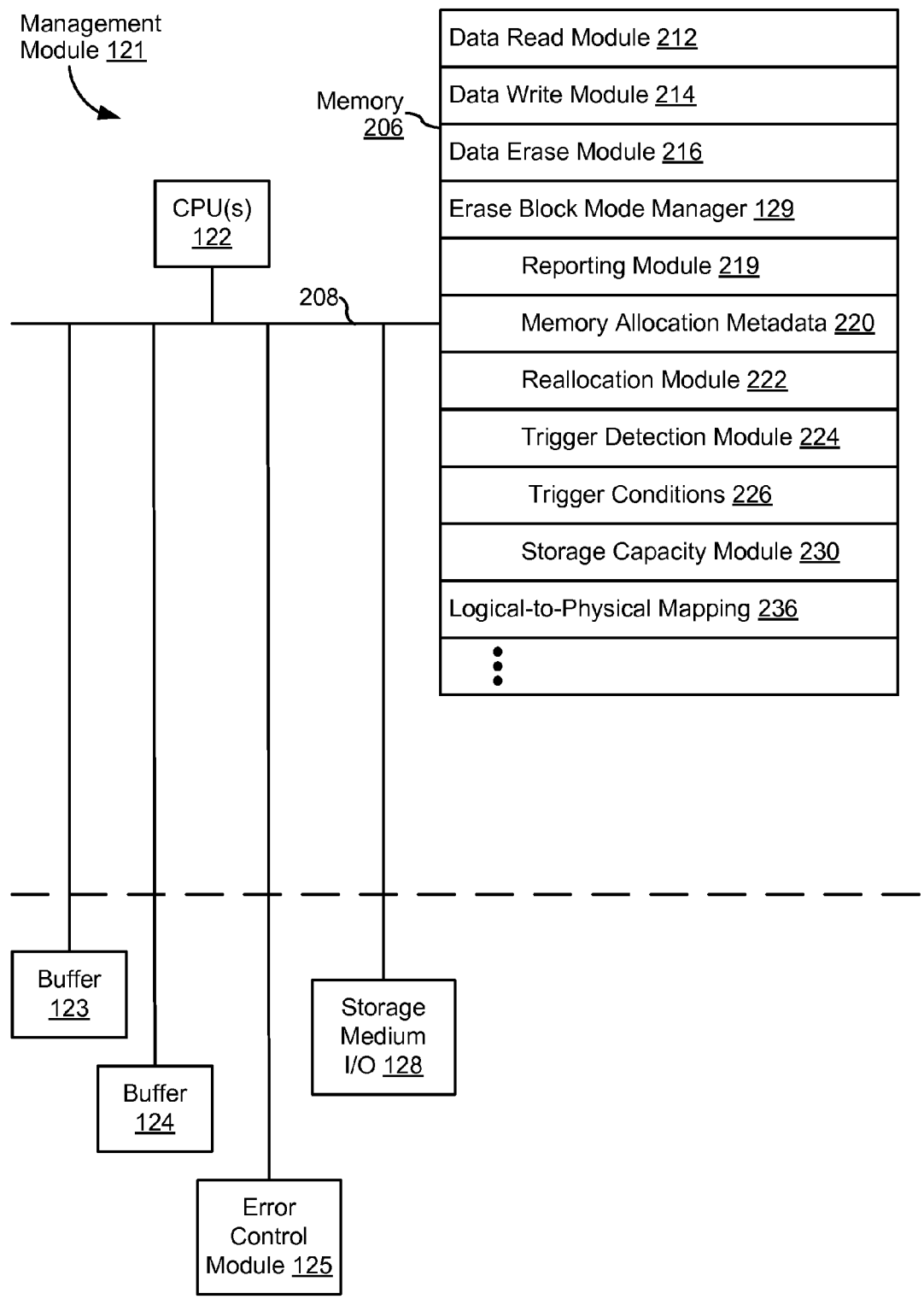
FIG. 2 is a block diagram illustrating a management module of a storage device controller, in accordance with some embodiments.

FIG. 2 is a block diagram illustrating an exemplary management module 121, in accordance with some embodiments. Management module 121 typically includes one or more processing units 122 (also sometimes called CPU(s), processing unit(s), microprocessor(s), microcontroller(s), or core(s)) for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Management module 121 is coupled with input buffer 123, output buffer 124, error control module 125, and storage device 130 by communication buses 208. Memory 206 includes volatile memory (e.g., one or more high-speed random access memory devices such as DRAM, SRAM, DDR RAM, or other random access solid state memory devices), and/or non-volatile memory (e.g., one or more NVM devices such as magnetic disk storage device(s), optical disk storage device(s), flash memory device(s), 3D memory device(s), or other non-volatile solid state storage device(s)). Memory 206 optionally includes one or more storage devices remotely located from one or more processing units 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset or superset thereof:

- data read module 212 for reading data, or causing data to be read, from storage device 130;
- data write module 214 for writing data, or causing data to be written, to storage device 130;
- data erase module 216 for erasing data, or causing data to be erased, from storage device 130;
- erase block mode manager 129 for assessing and performing memory reallocation on portions of one or more memory devices, and including the following or a subset or superset thereof:
- reporting module 219 for reporting, to the host (e.g., computer system 110, FIG. 1), the storage capacity and/or memory allocation (e.g., ratio of SLC to TLC memory) associated with a respective portion of storage device 130 (FIG. 1);
- memory allocation metadata 220 for storing information regarding the ratio of memory portions formatted with a first storage density to memory portions formatted with a second storage density (or other storage densities), including which memory portions (e.g., memory devices, die, blocks, word lines, or page portions) are formatted with a given storage density;
- reallocation module 222 for determining that the current memory allocation associated with a respective portion of storage device 130 (FIG. 1), needs modification, and selection of the specific memory portions to switch from the one storage density designation to another storage density designation (e.g., selecting SLC erase blocks that are not very worn out, or TLC erase blocks that are too worn out to operate in a current storage density designation (e.g., 3 bits per memory cell) but will still work in another storage density designation (e.g., 1 bit per memory cell));
- trigger detection module 224 for detecting satisfaction of one or more memory reallocation trigger conditions as to a respective portion of storage device 130 (FIG. 1);
- optionally, trigger conditions 226, including data representing one or more memory reallocation trigger conditions or representing one or more thresholds of the one or more memory reallocation trigger conditions, optionally including modifications to the memory reallocation trigger conditions (e.g., received from computer system 110, or system-generated);
- optionally, storage capacity module 230 to calculate the storage capacity of storage device 130 after a memory reallocation operation is performed; and
- logical-to-physical mapping 236 storing a logical-to-physical map which maps logical addresses recognized by the host (e.g., computer system 110, FIG. 1) to physical addresses of storage device 130 (FIG. 1).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise rearranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 3A-3C. In some embodiments, the above identified modules may be implemented in hardware, firmware, software, or a combination thereof. Further, one or more of the above identified modules may be implemented in whole or in part in hardware, for example, using one or more state machines.

Although FIG. 2 shows a management module 121, FIG. 2 is intended more as functional description of the various features which may be present in a management module than as a structural schematic of the embodiments described herein. In practice, and as recognized by those of ordinary skill in the art, items shown separately could be combined and some items could be separated.

Figure 3A:
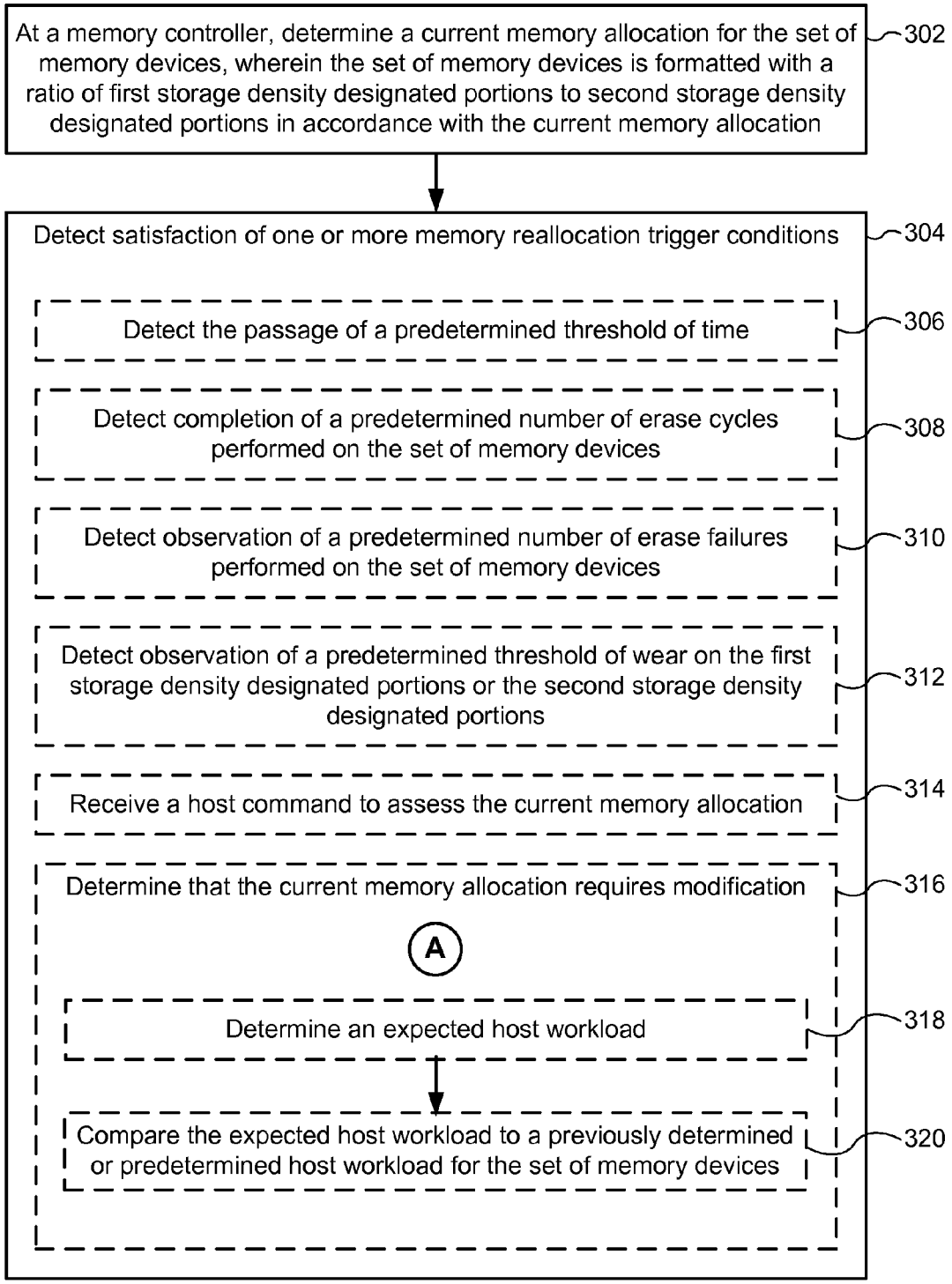
FIGS. 3A-3C illustrate a flowchart representation of a method of flash buffer sizing on one or more portions of memory, in accordance with some embodiments.
Figure 3B:
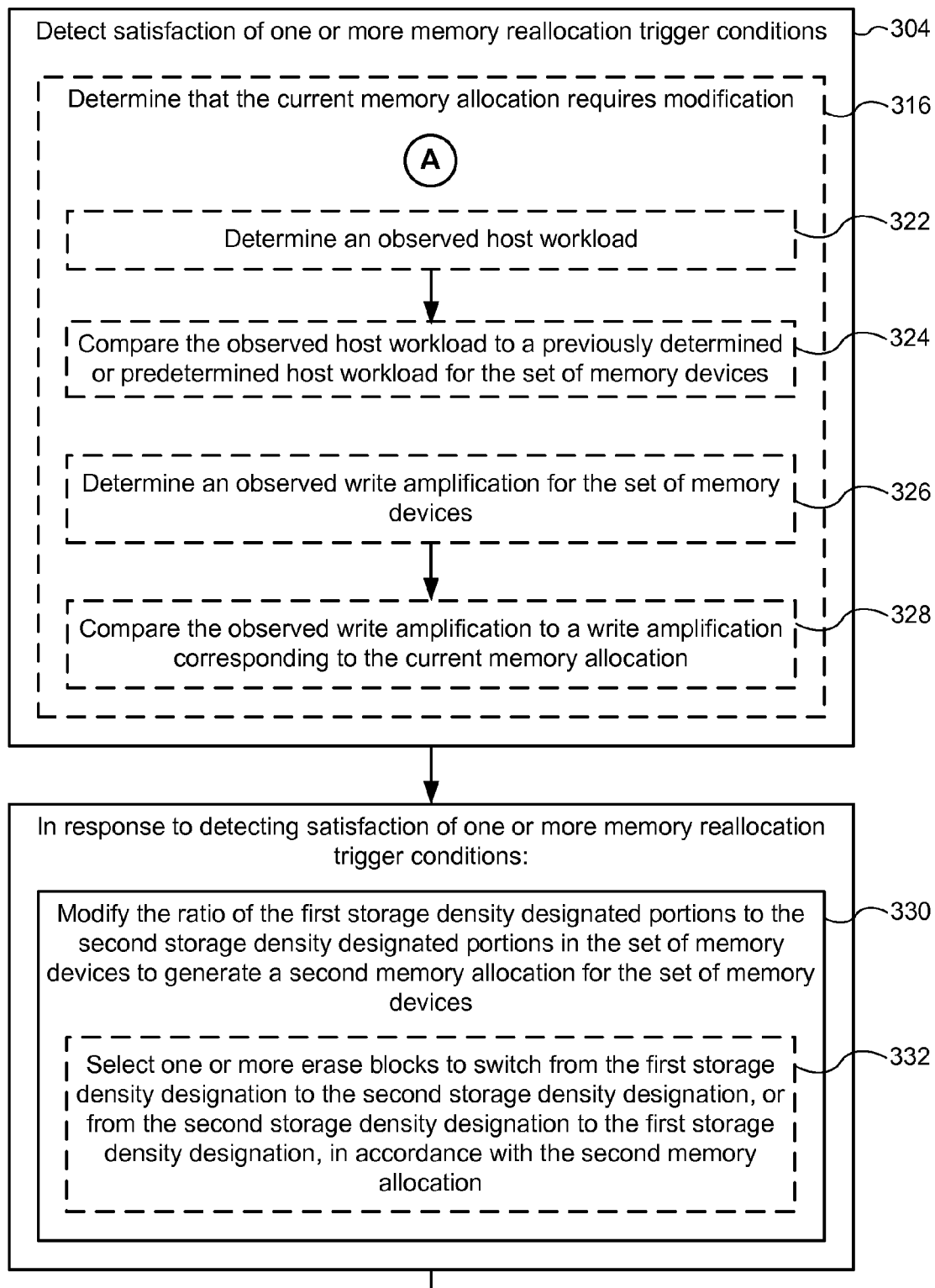
Figure 3C:
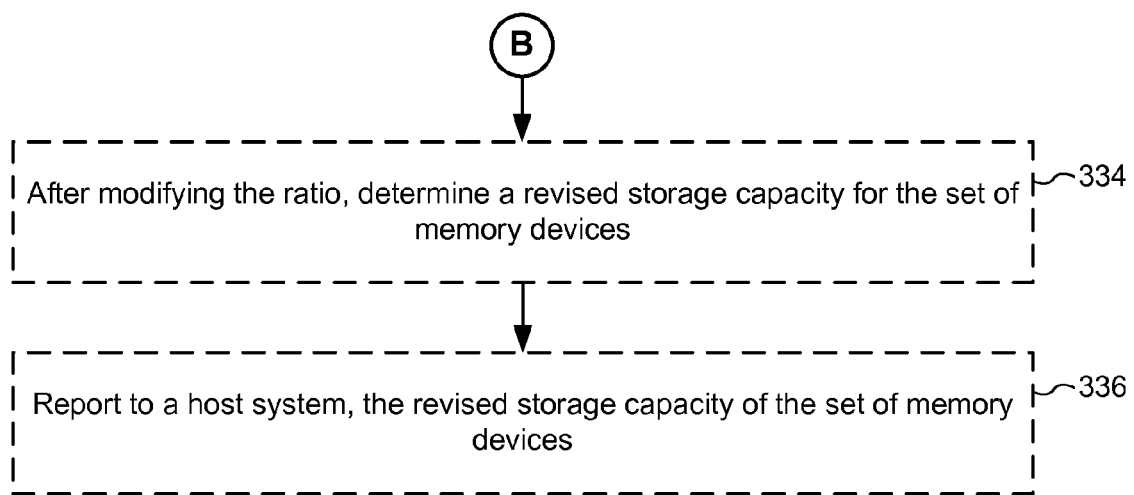

FIGS. 3A-3C illustrate a flowchart representation of method 300 of allocating memory in a data storage system that includes a memory controller and a set of memory devices, the set of memory devices including a plurality of memory portions, in accordance with some embodiments. At least in some embodiments, some or all of method 300 is performed by a data storage system (e.g., data storage system 100, FIG. 1) or one or more components of the storage system (e.g., memory controller 120, FIG. 1). In some embodiments, method 300 is governed by instructions that are stored in a non-transitory computer readable storage medium and that are executed by one or more processors of a data storage system 100 (FIG. 1). In some embodiments, method 300 is performed by or governed by one or more modules, for example an erase block mode manager module, and/or one or more of the sub-modules of erase block mode manager 129 described above.

The method includes, at a memory controller, determining (302) a current memory allocation for the set of memory devices, wherein the set of memory devices is formatted with a ratio of first storage density designated portions to second storage density designated portions in accordance with the current memory allocation. For example, a current memory allocation for a group of flash memory die is determined to be 95% TLC (triple-level cell) memory and 5% SLC (single-level cell) memory, and, as a result, the set of memory devices is formatted with 95000 TLC memory blocks and 5000 SLC memory blocks. In some embodiments, the first storage density is any memory density allowing for a greater number of bits per cell than allowed by the second storage density. In some embodiments, the set of memory devices is apportioned into more than two storage densities, each storage density corresponding to storage of a different number of bits per cell. In some embodiments, or in some circumstances, the current memory allocation is a default memory allocation or vendor-specified (e.g., manufacturer-specified) initial memory allocation, and the set of memory devices is pre-formatted with a ratio of first storage density designated portions to second storage density designated portions in accordance with the default or vendor-specified (e.g., manufacturer-specified) initial memory allocation.

The method includes detecting (304) satisfaction of one or more memory reallocation trigger conditions. For example, memory reallocation trigger conditions prompt assessment of the current memory allocation and adjusting the ratio of memory portions formatted with the first storage density to memory portions formatted with the second storage density. In some embodiments, a respective memory reallocation trigger condition is able to be modified by the host (e.g., computer system 110, FIG. 1). In some embodiments, a respective memory reallocation trigger condition is able to be modified by data storage system 100 (e.g., by erase block mode manager 129).

In some embodiments, detecting (304) satisfaction of one or more memory reallocation trigger conditions includes detecting (306) the passage of a predetermined threshold of time. For example, one memory reallocation trigger condition is satisfied if 168 hours have passed since the last time the memory allocation was assessed for reallocation. In some embodiments, the predetermined threshold of time is measured from the last time the memory allocation was assessed for reallocation, based on any reallocation trigger condition. In some embodiments, the predetermined threshold of time is automatically modified over time (e.g., as the memory device ages, the predetermined threshold of time is reduced, so the memory allocation is assessed more frequently; alternatively, after a predefined number of assessments have been performed, the predetermined threshold of time is increased).

In some embodiments, detecting (304) satisfaction of one or more memory reallocation trigger conditions includes detecting (308) completion of a predetermined number of erase cycles performed on the set of memory devices or a portion of the set of memory devices. In some embodiments, the predetermined number of erase cycles detected, is the number of erase cycles for the first storage density designated portions, or the number of erase cycles for the second storage density designated portions. In some embodiments a trigger condition is satisfied by detecting a predetermined number of write operations performed on all or a portion of storage device 130 (FIG. 1).

In some embodiments, detecting (304) satisfaction of one or more memory reallocation trigger conditions includes detecting (310) observation of a predetermined number of erase failures performed on the set of memory devices, or a portion of the set of memory devices. For example, detection of ten or more erase failures (e.g., attempts to erase ten blocks) on one group of die satisfies a memory reallocation trigger condition. In some embodiments, detecting (304) satisfaction of one or more memory reallocation trigger conditions includes detecting observation of a predetermined number of write or read failures performed on the set of memory devices.

In some embodiments, detecting (304) satisfaction of one or more memory reallocation trigger conditions includes detecting (312) observation of a predetermined threshold of wear on the first storage density designated portions or the second storage density designated portions. For example, if the first storage density is TLC and the second storage density is SLC, a trigger condition is satisfied if the portion of TLC memory is observed to be 50% worn. In some embodiments, the predetermined threshold of wear is an average threshold of wear for the entire first storage density designated memory portion or the second storage density designated portion (e.g., average wear of all first storage density erase blocks). In some embodiments, the predetermined threshold of wear is a percentage of wear (e.g., 60% worn), exhibited by a predetermined proportion of first storage density portions or second storage density portions (e.g., half of the TLC erase blocks, or one third of the SLC erase blocks).

In some embodiments, detecting (304) satisfaction of one or more memory reallocation trigger conditions includes receiving (314) a host command to assess the current memory allocation. In some embodiments, a host command (e.g., received from computer system 110, FIG. 1) triggers satisfaction of a memory reallocation condition, if the host command requests a report of the storage capacity of the set of memory devices, or requests a report of the ratio of first storage density portions to second storage density portions.

In some embodiments, detecting (304) satisfaction of one or more memory reallocation trigger conditions includes determining (316) that the current memory allocation requires modification. For example, detecting observation of a predetermined number of erase failures performed (or attempted to be performed) on the set of memory devices, results in a determination that the current memory allocation requires modification. In some embodiments, detecting satisfaction of one or more memory reallocation trigger conditions is enough to result in a determination that the current memory allocation requires modification.

In some embodiments, determining (316) that the current memory allocation requires modification includes determining (318) an expected host workload, and comparing (320) the expected host workload to a previously determined or predetermined host workload (e.g., a default or assumed host workload) for the set of memory devices. In some embodiments or in some circumstances, the previously determined or predetermined host workload is a default host workload or vendor-specified (e.g., manufacturer-specified) initial workload for the data storage system. In some embodiments, the expected host workload is a value or metric that indicates an expected characteristic of the memory operations that are expected or predicted to be performed on the set of memory devices. For example, the characteristic may be the percentage of host-specified write operations that are random writes, as opposed to sequential writes. In another example, the characteristic is a write amplification corresponding to the excepted host workload.

In some embodiments, determining (316) that the current memory allocation requires modification includes determining (322) an observed host workload, and comparing (324) the observed host workload to a previously determined or predetermined host workload (e.g., a default or assumed host workload) for the set of memory devices. In some embodiments, the observed host workload is a value or metric that indicates an observed (e.g., measured) characteristic of memory operations on the set of memory devices, observed over a predetermined period of time, or observed by a predetermined point in time. For example, the observed host workload may be observed over one week or operation, or over the period of time ending at a particular time (e.g., date and time). Further, the characteristic, for example, may be the percentage of host-specified write operations that are random writes, as opposed to sequential writes. In another example, the characteristic is a write amplification corresponding to the observed host workload.

In some embodiments, determining (316) that the current memory allocation requires modification includes determining (326) an observed write amplification for the set of memory devices, and comparing (328) the observed write amplification to a write amplification corresponding to the current memory allocation. In some circumstances, the current memory allocation is a default or initial memory allocation, and the write amplification corresponding to the current memory allocation is a default write amplification value corresponding to default or initial memory allocation. In some other circumstances, the current memory allocation is memory allocation that was determined, in the past, based on a previously observed write amplification, and "the write amplification corresponding to the current memory allocation" is the previously observed write amplification. For example, after a predetermined threshold of time has passed, it is observed that the set of memory devices in the memory device has a write amplification of 5, but the write amplification corresponding to the current memory allocation for this set of devices is 3. In this example, comparing the observed write amplification to the write amplification corresponding to the current memory allocation results in a determination that the current memory allocation requires modification (i.e., because the observed write amplification is inconsistent with the current memory allocation).

The method further includes, in response to detecting satisfaction of one or more memory reallocation trigger conditions, modifying (330) the ratio of the first storage density designated portions to the second storage density designated portions in the set of memory devices to generate a second memory allocation for the set of memory devices. In some embodiments, this modifying includes selecting (332) one or more erase blocks to switch from the first storage density designation to the second storage density designation, or from the second storage density designation to the first storage density designation, in accordance with the second memory allocation. For example, modifying the existing ratio of 95% TLC memory to 5% SLC memory within a memory device to a second ratio of 96% TLC memory to 4% SLC memory includes selecting a number of erase blocks of the SLC memory to convert to TLC memory.

In some embodiments, selection of the one or more erase blocks is made on the basis of the youngest or least worn blocks of the storage density to be reduced. For example, the 1000 least-worn SLC blocks are selected to be converted to TLC blocks, to provide the greatest possible length of life as TLC blocks. In some embodiments, selection of the one or more erase blocks is made on the basis of the oldest or most worn blocks of the storage density to be reduced. For example, the 1000 heaviest-worn TLC blocks are selected to be converted to SLC blocks, since they will have a longer remaining life as SLC blocks than as TLC blocks. In some embodiments, selection of the one or more erase blocks is performed as early as possible to preserve the remaining life of the blocks being converted. In some embodiments, selection of the one or more erase blocks includes determining the number of erase blocks to convert from one storage density designation to another storage density designation. In some embodiments, determining the number of erase blocks to convert involves assessing various factors, such as the age/wear of candidate blocks to be converted, the desired memory allocation and the efficiency of the conversion operation itself.

In some embodiments, the method further includes, after modifying the ratio, determining (334) a revised storage capacity for the set of memory devices. For example, converting blocks from a low storage density designation to a high storage density designation results in an increased storage capacity. In another example, converting blocks from a high storage density designation to a low storage density designation results in a decreased storage capacity. In some embodiments, the method further includes reporting (336) to a host system, the revised storage capacity of the set of memory devices.

In some embodiments, the storage system (e.g., data storage system 100, FIG. 1), includes one or more three-dimensional (3D) memory devices and circuitry associated with operation of memory elements in the one or more 3D memory devices. In some embodiments, the circuitry and one or more memory elements in a respective 3D memory device, of the one or more 3D memory devices, are on the same substrate. In some embodiments, the plurality of memory portions include non-volatile memory portions. In some embodiments, the plurality of memory portions includes NAND flash memory portions. In some embodiments, the storage system includes one or more flash memory devices.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible (e.g., a NOR memory array). NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

One of skill in the art will recognize that this invention is not limited to the two dimensional and three dimensional exemplary structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of allocating memory in a storage system that comprises a memory controller and a set of memory devices, the set of memory devices comprising a plurality of memory portions, the method comprising:
   at the memory controller:
      determining a current memory allocation for the set of memory devices, wherein the set of memory devices is formatted with a ratio of first storage density designated portions to second storage density designated portions in accordance with the current memory allocation;
      detecting satisfaction of one or more memory reallocation trigger conditions; and
      in response to detecting satisfaction of one or more memory reallocation trigger conditions:
         modifying the ratio of the first storage density designated portions to the second storage density designated portions in the set of memory devices to generate a second memory allocation for the set of memory devices;
         determining a revised storage capacity for the set of memory devices; and
         reporting, to a host system, the revised storage capacity of the set of memory devices, wherein the host system is coupled to the storage system for sending read and write host commands to the storage system.

2. The method of claim 1, wherein modifying the ratio of the first storage density designated portions to the second storage density designated portions in the set of memory devices comprises selecting one or more erase blocks to switch from the first storage density designation to the second storage density designation, or from the second storage density designation to the first storage density designation, in accordance with the second memory allocation.

3. The method of claim 1, wherein detecting satisfaction of one or more memory reallocation trigger conditions comprises detecting the passage of a predetermined threshold of time.

4. The method of claim 1, wherein detecting satisfaction of one or more memory reallocation trigger conditions comprises detecting completion of a predetermined number of erase cycles performed on the set of memory devices.

5. The method of claim 1, wherein detecting satisfaction of one or more memory reallocation trigger conditions comprises detecting observation of a predetermined number of erase failures performed on the set of memory devices.

6. The method of claim 1, wherein detecting satisfaction of one or more memory reallocation trigger conditions comprises detecting observation of a predetermined threshold of wear on the first storage density designated portions or the second storage density designated portions.

7. The method of claim 1, wherein detecting satisfaction of one or more memory reallocation trigger conditions comprises receiving a host command to assess the current memory allocation.

8. The method of claim 1, wherein detecting satisfaction of one or more memory reallocation trigger conditions includes determining that the current memory allocation requires modification.

9. The method of claim 8, wherein determining that the current memory allocation requires modification comprises:
   determining an expected host workload; and
   comparing the expected host workload to a predetermined host workload for the set of memory devices.

10. The method of claim 8, wherein determining that the current memory allocation requires modification comprises:
    determining an observed host workload; and
    comparing the observed host workload to a predetermined host workload for the set of memory devices.

11. The method of claim 8, wherein determining that the current memory allocation requires modification comprises:
    determining an observed write amplification for the set of memory devices; and
    comparing the observed write amplification to a write amplification corresponding to the current memory allocation.

12. A storage system, comprising:
a storage device including one or more memory devices, each with a set of memory portions; and
one or more modules configured to:
  determine a current memory allocation for a set of memory devices, wherein the set of memory devices is formatted with a ratio of first storage density designated portions to second storage density designated portions in accordance with the current memory allocation;
  detect satisfaction of one or more memory reallocation trigger conditions; and
  in response to detecting satisfaction of one or more memory reallocation trigger conditions:
    modify the ratio of the first storage density designated portions to the second storage density designated portions in the set of memory devices to generate a second memory allocation for the set of memory devices;
    determine a revised storage capacity for the set of memory devices; and
    report, to a host system, the revised storage capacity of the set of memory devices, wherein the host system is coupled to the storage system for sending read and write host commands to the storage system.

13. The storage system of claim 12, the storage system including a memory controller with one or more processors and memory storing one or more programs to be executed by the one or more processors, the one or more programs comprising instructions for performing the determining, detecting, modifying, determining, and reporting.

14. The storage system of claim 12, wherein modifying the ratio of the first storage density designated portions to the second storage density designated portions in the set of memory devices comprises selecting one or more erase blocks to switch from the first storage density designation to the second storage density designation, or from the second storage density designation to the first storage density designation, in accordance with the second memory allocation.

15. The storage system of claim 12, wherein detecting satisfaction of one or more memory reallocation trigger conditions includes determining that the current memory allocation requires modification.

16. A non-transitory computer-readable storage medium storing one or more programs configured for execution by a memory controller with one or more processors, the one or more programs comprising instructions for causing the memory controller to perform a sequence of operations, including:
  determining a current memory allocation for a set of memory devices, wherein the set of memory devices is formatted with a ratio of first storage density designated portions to second storage density designated portions in accordance with the current memory allocation;
  detecting satisfaction of one or more memory reallocation trigger conditions; and
  in response to detecting satisfaction of one or more memory reallocation trigger conditions:
    modifying the ratio of the first storage density designated portions to the second storage density designated portions in the set of memory devices to generate a second memory allocation for the set of memory devices;
    determining a revised storage capacity for the set of memory devices; and
    reporting, to a host system, the revised storage capacity of the set of memory devices, wherein the host system is coupled to the storage system for sending read and write host commands to the storage system.

17. The storage medium of claim 16, wherein modifying the ratio of the first storage density designated portions to the second storage density designated portions in the set of memory devices comprises selecting one or more erase blocks to switch from the first storage density designation to the second storage density designation, or from the second storage density designation to the first storage density designation, in accordance with the second memory allocation.

18. The storage medium of claim 16, wherein detecting satisfaction of one or more memory reallocation trigger conditions includes determining that the current memory allocation requires modification.

* * * * *